(12) United States Patent
Colangelo et al.

(10) Patent No.: US 9,673,621 B2
(45) Date of Patent: Jun. 6, 2017

(54) ENHANCED BATTERY SYSTEM AND METHOD

(71) Applicant: Powerful Battery Solutions LLC, Woodland Hills, CA (US)

(72) Inventors: Joseph Michael Colangelo, South Pasadena, CA (US); Gordon Tadao Eto, Woodland Hills, CA (US)

(73) Assignee: Powerful Battery Solutions LLC, Woodland Hills, CA (US)

( * ) Notice: Subject to any disclaimer, the term of this patent is extended or adjusted under 35 U.S.C. 154(b) by 443 days.

(21) Appl. No.: 14/283,637

(22) Filed: May 21, 2014

(65) Prior Publication Data

US 2014/0346873 A1 Nov. 27, 2014

Related U.S. Application Data

(60) Provisional application No. 61/826,824, filed on May 23, 2013.

(51) Int. Cl.
| | |
|---|---|
| *H02J 1/00* | (2006.01) |
| *H02J 7/00* | (2006.01) |
| *H02J 7/35* | (2006.01) |
| *G01R 31/36* | (2006.01) |

(52) U.S. Cl.
CPC ............ *H02J 1/00* (2013.01); *G01R 31/3689* (2013.01); *H02J 7/0021* (2013.01); *H02J 7/0024* (2013.01); *H02J 7/0042* (2013.01); *H02J 7/0047* (2013.01); *G01R 31/3606* (2013.01); *H02J 7/355* (2013.01); *Y10T 307/391* (2015.04); *Y10T 307/696* (2015.04)

(58) Field of Classification Search
CPC ........................................................ H02J 7/355
USPC ................................................... 307/150, 66
See application file for complete search history.

(56) References Cited

U.S. PATENT DOCUMENTS

| | | | |
|---|---|---|---|
| 5,360,307 A | 11/1994 | Schemm et al. | |
| 9,192,772 B1* | 11/2015 | Tsukamoto | .......... A61N 1/3787 |
| 2011/0084663 A1 | 4/2011 | Troxel et al. | |
| 2011/0298626 A1 | 12/2011 | Fechalos et al. | |
| 2012/0295136 A1 | 11/2012 | Nam et al. | |
| 2013/0271072 A1* | 10/2013 | Lee | ................... H01M 10/4207 320/108 |

FOREIGN PATENT DOCUMENTS

JP 2004-032881 1/2004

* cited by examiner

*Primary Examiner* — Robert Deberadinis
(74) *Attorney, Agent, or Firm* — Seed IP Law Group LLP

(57) ABSTRACT

Various systems and methods for managing a plurality of battery modules are disclosed herein. In one embodiment, a system may include two or more battery modules with each battery module having a state of charge. The system may include at least one battery management system for monitoring the state of charge of each of the battery modules. The system may include a communications network in communication with the at least one battery management system whereby the at least one battery management system provides data regarding the state of charge for each battery module using the communication network.

49 Claims, 6 Drawing Sheets

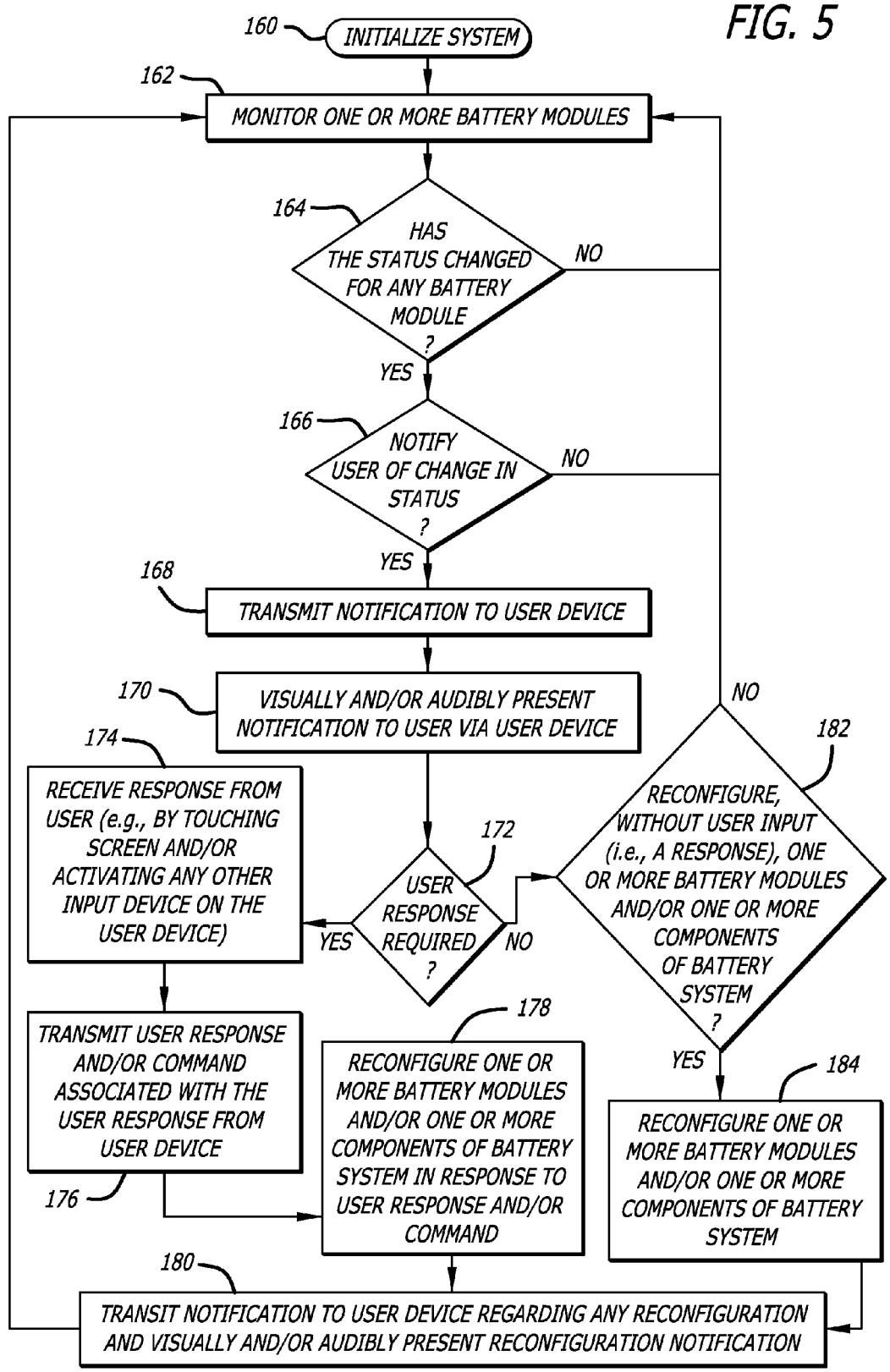

ENHANCED BATTERY SYSTEM AND METHOD

CROSS-REFERENCE TO RELATED APPLICATIONS

This application claims the benefit of U.S. Provisional Application No. 61/826,824, filed May 23, 2013, which is herein incorporated by reference in its entirety.

TECHNICAL FIELD

This description relates to various systems and methods for managing a plurality of battery modules.

BACKGROUND

A battery provides electrical energy based on its chemistry. Depending on the chemistry of the battery, the battery may be disposable or rechargeable. Common chemistries of rechargeable batteries include lead-acid, nickel metal hydride, lithium-ion, and lithium iron phosphate. Of course, many other batteries have different chemical makeups depending on the application and cost constraints. The characteristics of a battery (e.g., voltage, energy capacity, and energy output) vary depending on the number of cells and the cell chemistry. However, common among all rechargeable batteries is the finite continuous energy available.

Certain industries (e.g., entertainment, medical, and military) call for portable, finite power sources (i.e., batteries) even though continuous power from, for example, a wall outlet, may be preferred. For example, the entertainment industry often powers cameras and lighting with inadequate, low capacity batteries or noisy gas-powered generators. Currently, there is no system available to provide continuous power to a motion picture set without experiencing downtime due to recharging and/or replacing batteries. In this regard, there remains a need to provide a rechargeable battery module system that is capable of providing continuous power despite the power being battery-driven.

SUMMARY

Briefly, and in general terms, various embodiments are directed to an enhanced battery system and method that provides efficient management of a plurality of battery modules.

In some embodiments, a system may include two or more battery modules with each battery module having a state of charge. The system may include at least one battery management system for monitoring the state of charge of each of the battery modules. The system may include a communications network in communication with the at least one battery management system whereby the at least one battery management system provides data regarding the state of charge for each battery module using the communication network.

In some embodiments, a system may include a cart having a base with wheels. The system may include two or more battery modules removably attached to the cart with each battery module having a state of charge. The system may include at least one battery management system for monitoring the state of charge of each of the battery modules. The system may include a communications network in communication with the at least one battery management system whereby the at least one battery management system provides data regarding the state of charge for each battery module using the communication network.

In some embodiments, a method for providing energy via a battery system may include associating two or more battery modules in combination together, wherein each battery module has a state of charge. The method may include monitoring the plurality of battery modules using a battery management system to determine the state of charge of each battery module. The method may include maintaining the plurality of battery modules so that at least one battery module is in a state of charge while another battery module is being used to provide energy to one or more devices. The method may include reconfiguring the plurality of battery modules when the at least one charged battery module reaches depletion to enable the one or more remaining charged battery modules to provide energy to the one or more devices.

In some embodiments, a method for managing a plurality of battery modules may include providing a battery system including a first rechargeable battery module and a second rechargeable battery module. The first and second rechargeable battery modules may be in communication with a hardware processor. The method may include providing a network interface in communication with the hardware processor. The network interface may enable the hardware processor to transmit data over a network. The method may include providing at least one battery management system in communication with the first battery module. The method may include providing at least one battery management system in communication with the second battery module. The method may include determining, by the hardware processor, whether a notification event related to the first or second battery module has occurred. The method may include transmitting notification data over the network when the notification event occurs.

In some embodiments, a system for managing a battery module system includes a non-transitory memory in communication with a processor. The non-transitory memory may have instructions stored thereon that, in response to execution by the processor, cause the processor to perform operations. The operations may include determining whether a notification event related to at least one battery module has occurred. The operations may include disconnecting, without user input, a first system component from the at least one battery module based on the occurrence of the notification event. The first system component may include a charger, an inverter, a converter, a power connector, a second battery module, or any other component. The operations may include connecting, without user input, a second system component to the at least one battery module based on the occurrence of the notification event. The second system component may include a charger, an inverter, a converter, a power connector, a second battery module, or any other component.

In some embodiments, a system for managing a battery module system may include a non-transitory memory in communication with a processor. The non-transitory memory may have instructions stored thereon that, in response to execution by the processor, cause the processor to perform operations. The operations may include determining whether a notification event related to at least one battery module has occurred. The operations may include transmitting notification data over a network to a client device when the notification event occurs. The operations may include processing client device data transmitted by the client device over a network. The operations may include disconnecting a first system component from the at least one battery module based on the client device data. The first system component may include a charger, an inverter, a converter, a power connector, a second battery module, or any other component. The operations may include connecting a second system component to the at least one battery module based on the client device data. The second system component may include a charger, an inverter, a converter, a power connector, a second battery module, or any other component.

In some embodiments, a system for managing a battery module system may include a computing device operable to determine whether a notification event related to at least one battery module has occurred. The computing device may be operable to disconnect, without user input, a first system component from the at least one battery module based on the occurrence of the notification event. The first system component may include a charger, an inverter, a converter, a power connector, a second battery module, or any other component. The computing device may be operable to connect, without user input, a second system component to the at least one battery module based on the occurrence of the notification event. The second system component may include a charger, an inverter, a converter, a power connector, a second battery module, or any other component.

In some embodiments, a system for managing a battery module system may include a computing device operable to determine whether a notification event related to at least one battery module has occurred. The computing device may be operable to transmit notification data over a network to a client device when the notification event occurs. The computing device may be operable to process client device data transmitted by the client device over a network. The computing device may be operable to disconnect a first system component from the at least one battery module based on the client device data. The first system component may include a charger, an inverter, a converter, a power connector, a second battery module, or any other component. The computing device may be operable to connect a second system component to the at least one battery module based on the client device data. The second system component may include a charger, an inverter, a converter, a power connector, a second battery module, or any other component.

In some embodiments, a system may include one or more memories in communication with one or more hardware processors of one or more computing devices. The one or more memories may have instructions stored thereon that, in response to execution by the one or more computing devices, cause the one or more computing devices to perform operations. The operations may include determining whether a notification event related to at least one battery module has occurred. The operations may include disconnecting, without user input, a first system component from the at least one battery module based on the occurrence of the notification event. The first system component may include a charger, an inverter, a converter, a power connector, a second battery module, or any other component. The operations may include connecting, without user input, a second system component to the at least one battery module based on the occurrence of the notification event. The second system component may include a charger, an inverter, a converter, a power connector, a second battery module, or any other component.

In some embodiments, a system may include one or more memories in communication with one or more hardware processors of one or more computing devices. The one or more memories may have instructions stored thereon that, in response to execution by the one or more computing devices, cause the one or more computing devices to perform operations. The operations may include determining whether a notification event related to at least one battery module has occurred. The operations may include transmitting notification data over a network to a client device when the notification event occurs. The operations may include processing client device data transmitted by the client device over a network. The operations may include disconnecting a first system component from the at least one battery module based on the client device data. The first system component may include a charger, an inverter, a converter, a power connector, a second battery module, or any other component. The operations may include connecting a second system component to the at least one battery module based on the client device data. The second system component may include a charger, an inverter, a converter, a power connector, a second battery module, or any other component.

In some embodiments, a system may include a first battery module and a second battery module. Each battery module may include one or more rechargeable electrochemical cells. Each battery module may have at least three states associated with it: charging, discharging, and standby. The system may include at least one battery management system connected to the first battery module. The system may include at least one battery management system connected to the second battery module. The system may include a first housing. The first battery module may reside within the first housing. The system may include a second housing. The second battery module may reside within the second housing. The system may include a hardware processor in communication with the at least one battery management system connected to the first and second battery modules. The at least one battery management system connected to the first battery module may be configured to transmit information related to the first battery module to the hardware processor. The at least one battery management system connected to the second battery module may be configured to transmit information related to the second battery module to the hardware processor. The hardware processor unit may be configured to determine the state of the first and second battery modules. The hardware processor may be enabled to alter to the state of the first battery module or the second battery module without user input based on information associated with at least one of the battery modules.

In some embodiments, an article of manufacture may include a non-transitory computer readable medium having instructions stored thereon that, in response to execution by a computing device, cause the computing device to perform operations. The operations may include determining whether a notification event related to at least one battery module has occurred. The operations may include disconnecting, without user input, a first system component from the at least one battery module based on the occurrence of the notification event. The first system component may include a charger, an inverter, a converter, a power connector, a second battery module, or any other component. The operations may include connecting, without user input, a second system component to the at least one battery module based on the occurrence of the notification event. The second system component may include a charger, an inverter, a converter, a power connector, a second battery module, or any other component.

In some embodiments, an article of manufacture may include a non-transitory computer-readable medium having instructions stored thereon that, in response to execution by a computing device, cause the computing device to perform operations. The operations may include determining whether a notification event related to at least one battery module has occurred. The operations may include transmitting notification data over a network to a client device when the notification event occurs. The operations may include processing client device data transmitted by the client device over a network. The operations may include disconnecting a first system component from the at least one battery module based on the client device data. The first system component may include a charger, an inverter, a converter, a power connector, a second battery module, or any other component. The operations may include connecting a second system component to the at least one battery module based on the client device data. The second system component may include a charger, an inverter, a converter, a power connector, a second battery module, or any other component.

The foregoing summary does not encompass the claimed invention in its entirety, nor are the embodiments intended to be limiting. Rather, the embodiments are provided as mere examples.

BRIEF DESCRIPTION OF THE DRAWING

FIG. 5 depicts a flow diagram according to one feature of one embodiment of the enhanced battery system.

DETAILED DESCRIPTION

Figure 1A:
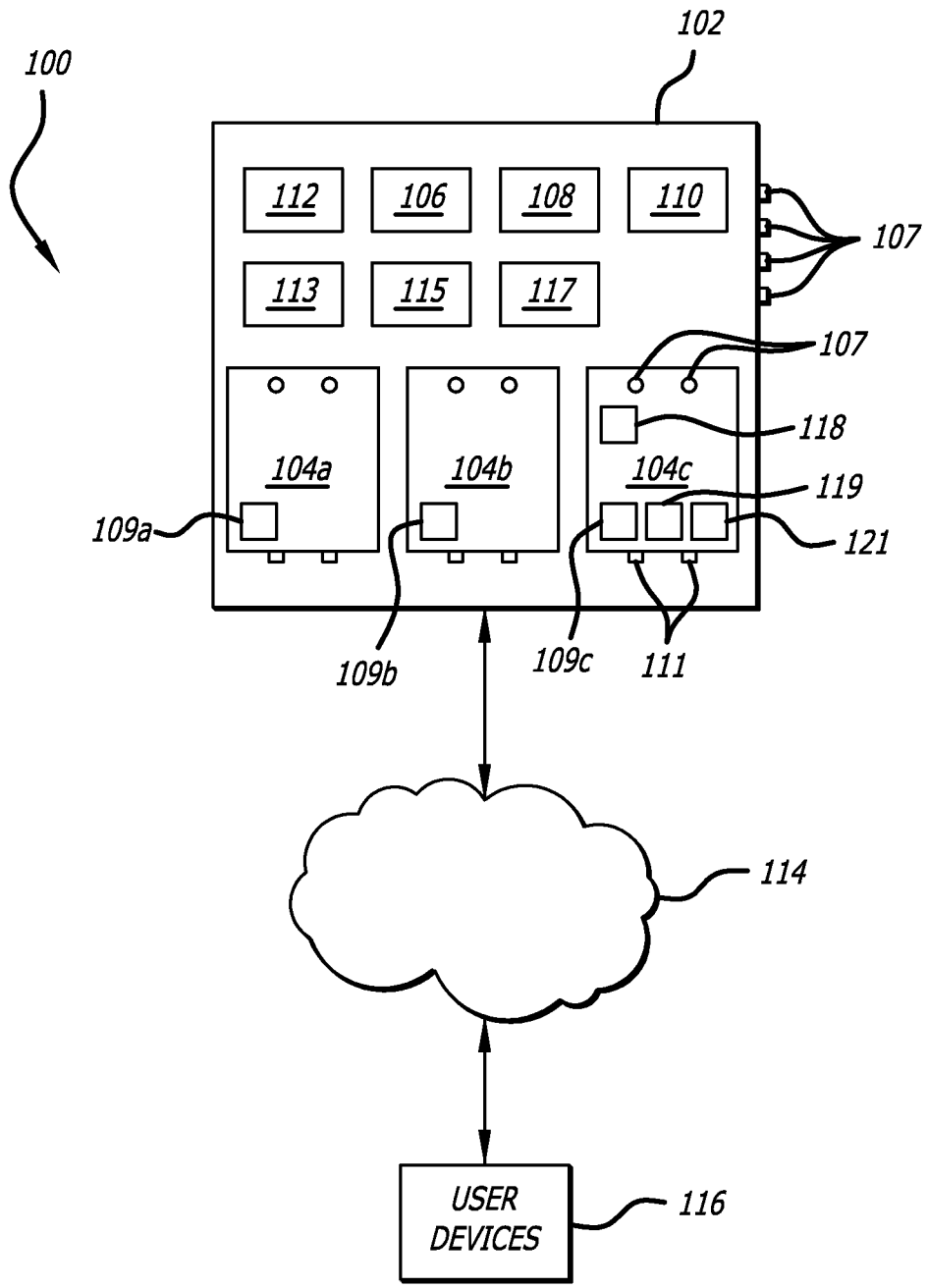
FIG. 1A depicts a simplified block diagram of an enhanced battery system according to one embodiment.

Referring now to the drawings, wherein like reference numerals denote like or corresponding parts throughout the drawings and, more particularly to FIGS. 1-5, there are shown various embodiments of an enhanced battery system 100 and methods associated therewith. In some embodiments, the enhanced battery system 100 and method may be configured to provide continuous power despite the power being provided by one or more battery modules. In other embodiments, the enhanced battery system 100 may be configured to function as an efficient recharging station for one or more battery modules.

As used herein, the terms "battery," "battery module," and "battery pack" refer to one or more rechargeable electrochemical cells that may be connected in series, parallel, or a combination thereof. In this regard, the terms "cell," "battery," "battery module," or "battery pack" may be used interchangeably to generally refer to an energy storage apparatus. For example, some batteries have more than one cell whereas some batteries contain a single cell. For example, a typical 9V battery and a typical AA battery. The typical 9V battery has six 1.5V cells connected in series resulting in a total nominal system voltage of 9V, whereas the typical AA battery has one cell with a nominal system voltage of 1.5V. Each battery module is configured to provide any nominal system DC voltage. The nominal system voltage of a battery module may be at 10 VDC, 50 VDC, or any voltage between 10 VDC and 50 VDC. The nominal system voltage of a battery module may be below 10 VDC or above 50 VDC. Each battery module may be configured to provide a power output between 500 W and 3.5 kW. Of course each battery module may be configured to provide a power output at or below 500 W, or at or above 3.5 kW. The weight of each battery module may be less than, equal to, or greater than 100 pounds.

As used herein, the term "cell" refers to any rechargeable electrochemical cell. For example, according to one embodiment, the cells described herein may be lithium iron phosphate battery cells. Of course, those of ordinary skill in the art will appreciate that the cells described herein may have a different chemistry than that of lithium iron phosphate.

As used herein, the terms "run time" or "discharge time" refers to the time it takes to discharge one or more battery modules from a first capacity to a second capacity based on, for example, a given load. According to some embodiments, a first capacity may be a fully-charged battery module and the second capacity may be a fully-discharged battery module. A load may include one or more system components. For example, a load may be one or more devices, such as a camera and/or lights (e.g., ARRI® M18 HMI light), that draw current at a voltage provided by the one or more battery modules.

Referring now to FIG. 1A, one embodiment of an enhanced battery system 100 is shown. The enhanced battery system 100 includes a structure 102. The structure 102 may include a cart, dolly, mobile enclosure, or any other mobile structure. The structure 102 may be configured to temporarily or permanently house or otherwise hold one or more battery module cases 104, one or more chargers 106 (e.g., a 1.5 kW charger, a 3 kW charger, or any other charger such as a charger that utilizes solar energy), one or more DC-to-AC inverters 108 (e.g., a 1.5 kW inverter, a 3 kW inverter, a 3 kW pure sign wave inverter, or any other inverter), and/or one or more DC-to-DC converters 110. Of course, appropriate connectors and wiring allow communication and use of the system components in various combinations. In some embodiments, one or more battery modules 105 are housed inside a battery case 104, and may be charged while being transported in a vehicle by using solar energy and/or using power generated by the alternator of the vehicle. One or more of the battery cases 104, chargers 106, inverters 108, or converters 110 may or may not be removably attached to or engaged with the structure 102. The structure 102 and/or cases 104 may include one or more power connectors 107 that may be connected to an AC voltage source (e.g., 120 VAC, 220 VAC, or any other AC voltage) that may be connected to the one or more chargers 106. Of course, in some embodiments, the enhanced battery system 100 may not include a structure 102. Instead, each component may be connected to each other as the user deems acceptable.

In some embodiments, again as shown in FIG. 1A, the enhanced battery system 100 may include a network interface 112 that enables the structure 102 or any component of the structure 102 (e.g., one or more of the battery cases 104, a battery management system, or any other component of the system) to communicate over a wired or wireless network 114 with one or more user devices 116. In some embodiments, one or more components of the enhanced battery system 100 (e.g., one or more cases 104, battery modules 105, chargers 106, power connectors 107, inverters 108, battery management systems 109, converters 110, docking connectors 111, network interfaces 112, power connector controller 113, or hot swap controller 117; or any other component of the enhanced battery system) may be connected to a hardware processing unit (e.g., a hardware processor, a specialized hardware processor, or any hardware that may process data with or without software instructions) that processes data received by the components. The hardware processing unit may receive data from or transmit data to any component over a network, system bus, or the like. The hardware processing unit may transmit data over a network to a client device using the network interface. For example, the hardware processor may determine a load is connected to two power connectors (i.e., the anode power connector and the cathode power connector) or a single power connector having both anode and cathode connection points. The power connector(s) may transmit, for example, data to the hardware processing unit upon a cable being attached thereto (i.e., connected to the case) or removed therefrom (i.e., disconnected from the case). As another example, a battery management system may transmit information related to the battery module to the hardware processing unit. The hardware processing unit may perform further processing on the data received from a battery management system or any other component. The hardware processing unit may determine a notification event has occurred based on the data received from any component in the system. In other embodiments, each component may be connected to its own network interface that enables the component to transmit data over a network. In such embodiments, any component may communicate directly with a client device over a network.

Figure 1B:
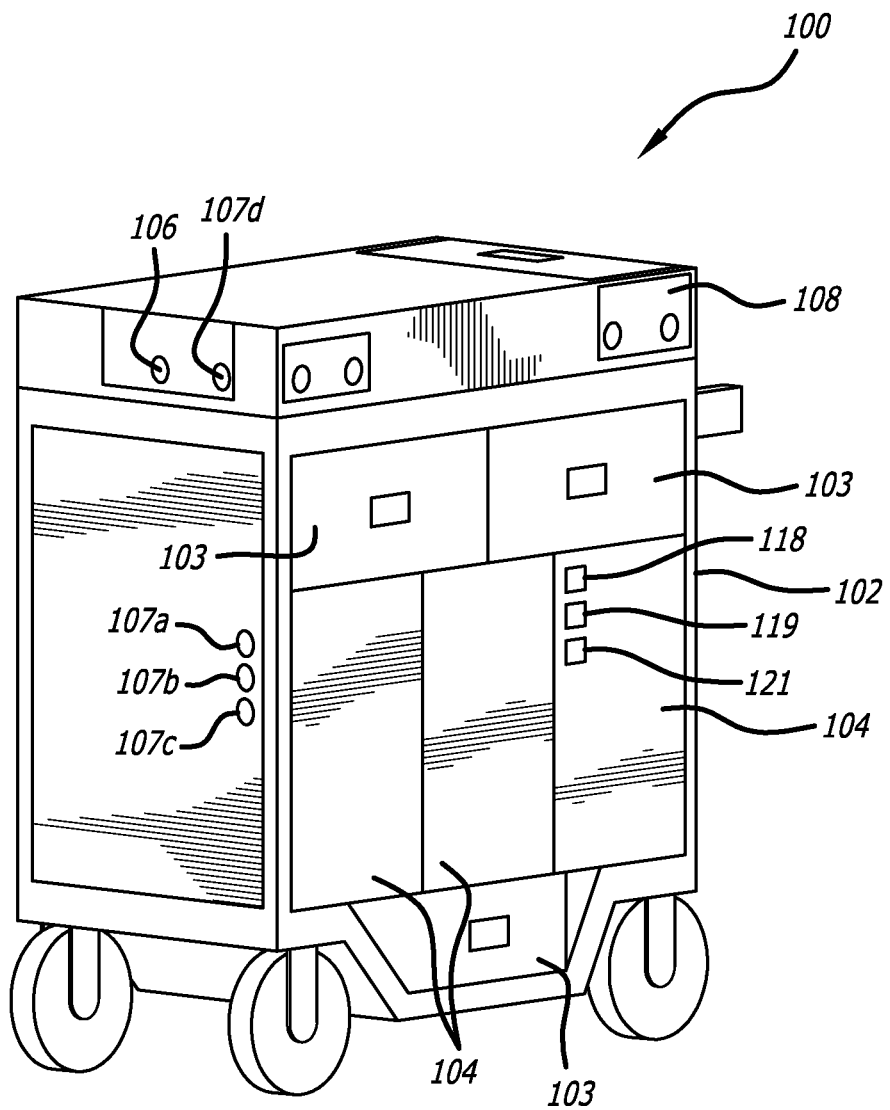
FIG. 1B shows one embodiment of a more detailed enhanced battery system 100.

FIG. 1B shows one embodiment of a more detailed, but still simplified, enhanced battery system 100. The structure 102 is shown as a cart having four wheels at the base. The structure includes storage drawers 103 that may be used to store any component and/or accessory of the enhanced battery system (e.g., cables, external inverters, converters, or any other system component). The embodiment shown in FIG. 1B shows that the battery cases 104*a-c* may be docked adjacent to one another. FIG. 1B also shows a charger 106 and inverter 108 attached to the structure 102. The charger 106 includes one power connector 107*d* that is used to connect, for example, 120 VAC to the charger. The enhanced battery system 100 shown in FIG. 1B also includes three charging ports (i.e., power connectors 107*a-c*). In the embodiment shown, a user need only connect the charger 106 to the charging port associated with the battery module that the user wishes to charge. For example, connecting the charger 106 to power connector 107*a* would result in delivering a charge current to the battery module housed in case 104*a*.

The one or more user devices 116 (also referred to as client devices) may include any computing device or system, such as a desktop computer, laptop computer, tablet computer, smartphone, mobile device, or the like. The enhanced battery system 100 may be configured to transmit data (e.g., a notification) to one or more user devices 116. Likewise, the one or more user devices 116 may be configured to transmit data to the enhanced battery system 100. For example, the enhanced battery system 100 may transmit a notification, alert, or any message containing information related to the enhanced battery system to one or more user devices 116.

According to some embodiments, the enhanced battery system 100 may be configured to transmit a notification to one or more user devices 116 when a notification event occurs. The notification may or may not require user action. For example, a notification event may include when a battery module 105 is discharged to or below a defined capacity level (e.g., 0%, 5%, 10% or any other percentage of energy capacity available for discharge). The enhanced battery system 100 may transmit data (i.e., a notification) representative of the notification event occurring (or has occurred or is about to occur) that may be presented on one or more user devices 116. With respect to the battery module 105 being discharged below a defined capacity level, the enhanced battery system 100 may transmit data that may be presented on one or more user devices 116 that informs a user that a battery module 105 has been discharged to or below a defined capacity level. The user may or may not be required to transmit instructions back to the enhanced battery system 100 regarding an action to be taken (e.g., instruct the enhanced battery system 100 to connect any active loads to a standby battery module if the system is configured to not automatically "shuffle" battery modules). For example, the one or more user devices 116 may have an application installed thereon that provides a graphical user interface that a user may interact with by touching the screen of a user device. In this regard, those of ordinary skill in the art will appreciate that a notification event may include any event related to the enhanced battery system 100.

For example, a notification event may include (i.e., occur or otherwise trigger) when a battery module 105 has been connected to a charger, when a battery module has been fully charged, when a battery a battery module has been charged above a defined capacity level, when a battery module is removed from a charger, when a load is drawing power from a battery module, when the projected discharge time of a battery module to or below a defined capacity level is less than the projected charge time of a battery module to or above a defined capacity level (e.g., 50%, 70%, 100%, or any other percentage of energy capacity available for discharge). It is appreciated that any notification event may include a corresponding notification that may be presented to a user of the enhanced battery system 100 on a component of the system (e.g., a case, a client device, the structure, or anything else). A notification event may include when a battery module 105 has been connected to an inverter or a converter, when a battery module has been placed in parallel or series with another battery module, when a battery module is undocked from and docked to the structure, when a battery module has more than one load connected to it in series or in parallel, or when there is no standby battery module. A notification event may occur when a battery module remains discharged below a threshold energy capacity for a period of time (e.g., 5 minutes, 10 minutes, or any amount of time). Such a notification may, for example, alert a user that a battery module 105 that should be charging is not charging. A notification event may occur when a battery module 105 changes states (e.g., charging to standby, charging to discharging, discharging to charging, discharging to standby, standby to charging, standby to discharging). A notification event may occur when an ammeter reading reaches a certain value (e.g., a minimum current or a maximum current value), or when a circuit breaker has been switched over interrupting current flow.

Those of ordinary skill in the art will appreciate that the notification events listed herein are merely examples and that any event related to the enhanced battery system (such as reconfiguring a power connector connection) may serve as a notification event that may or may not be visually and/or audibly presented to a user via a user/client device 116. In some embodiments, the enhanced battery system 100 may visually and/or audibly present a notification event to a user using a display and/or speaker attached to the structure.

In the embodiment shown, the enhanced battery system 100 includes three cases 104a, 104b, and 104c. Each battery case 104 (i.e., any housing or vessel) holds a battery module 105 (not shown in FIG. 1B). According to one embodiment of a battery module 105, the discharge time based on a 3 kW load may be 73 minutes, whereas the time it takes to charge the battery module 105 to full energy capacity may be less than 73 minutes (e.g., 54 minutes). The minimum charge current may be 1C and the maximum charge current may be 2C. Of course, it will be appreciated that these times may vary based on the load, configuration of the battery module 105, charger 106, and other system components. Thus, various discharge times may be used. Likewise, the minimum and maximum charge currents may vary as well. In this regard, a plurality of battery modules 105 may be shuffled by a user or the enhanced battery system 100 to ensure that a load receives continuous power despite a plurality of battery modules 105 being connected and disconnected from the load while each is respectively discharged and charged. For example, since the charge time is less than the discharge time, a discharged battery module may become fully charged before a discharging battery module is fully discharged. Before the discharging battery module is fully discharged, a fully charged battery module may be connected to the load in parallel with the almost depleted battery module.

Figure 2A:
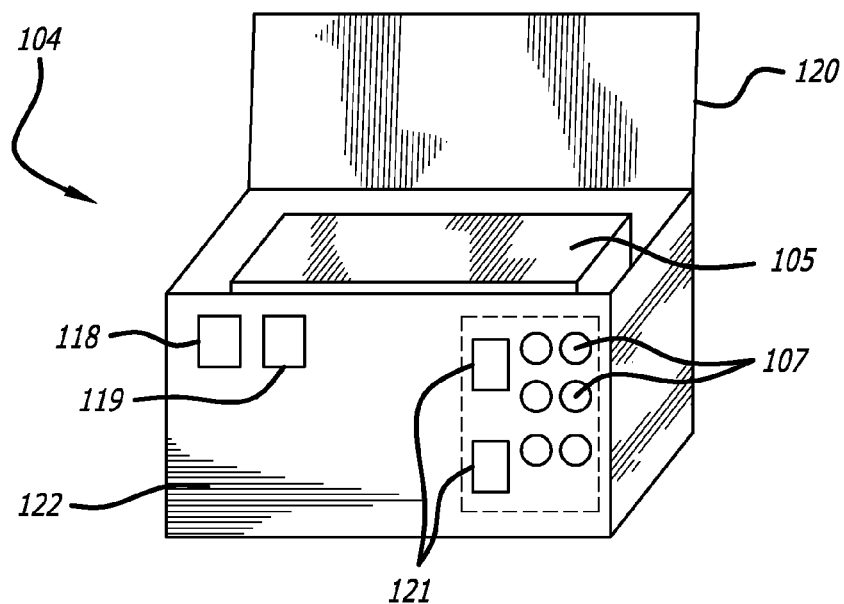
FIG. 2A depicts a case that houses a battery module according to one embodiment.

FIG. 2A depicts one embodiment of a case 104 that houses a battery module 105. The case depicted includes a lid 120 that is configured to lock or unlock with the base 122. As shown, the battery module 105 is housed inside the case 104. The battery case 104 includes power connectors 107, an energy capacity gauge 118, an ammeter 119, and two circuit breakers 121. In the embodiment shown, the ammeter 119 informs a user of the total instantaneous current draw from the battery module 105. Additionally or alternatively, the battery case 104 may include an ammeter for each set of power connectors (e.g., an ammeter for the top row of power connectors, an ammeter for the middle row of power connectors 107, and an ammeter for the bottom row of power connectors 107). In the embodiment shown, the case 104 includes two circuit breakers 121. One of the circuit breakers 121 is associated with the top four power connectors 107, and the other circuit breaker 121 is associated with the bottom two power connectors 107. Of course, in other embodiments, the battery case 104 may only include one circuit breaker 121 that is connected to all power connectors 107.

Figure 2B:
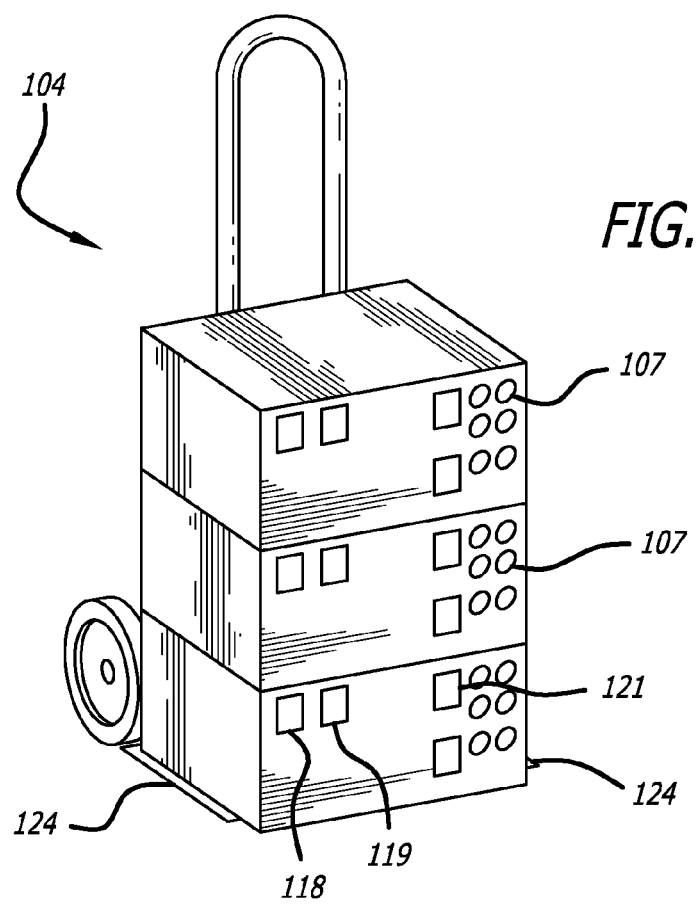
FIG. 2B depicts an enhanced battery system according to one embodiment.

FIG. 2B depicts one embodiment of an enhanced battery system 100. This embodiment of the enhanced battery system 100 includes a plurality of cases 104 stacked one upon the other. The cases 104 may be configured such that they may interlock (i.e., lock together) to provide system stability while the enhanced battery system is stationary or mobile. According to one embodiment, magnets may be built into the lid 120 and the base 122 of each case 104 so that the cases may be interlocked to one another. In other embodiments, the lid 120 and the base 122 of each case 104 may include mechanical and/or electromechanical interlocking members (e.g., male and female interlocking members) that cause the cases to be interlocked when engaged. For example, the bottom of the base 122 of one case 104 may include interlocking members that may engage interlocking members positioned on the top of the lid 120 of another case 104. The three cases depicted are the same embodiment of the case shown in FIG. 2A. Nevertheless, the case may vary based on the size of the battery module and other design considerations. In the embodiment shown in FIG. 2B, the structure 102 is a dolly. The base 124 of the structure 102 may include the magnets or interlocking members discussed above so that the bottom case 104 may interlock with the base of the transport structure to provide further stability.

Figure 3A:
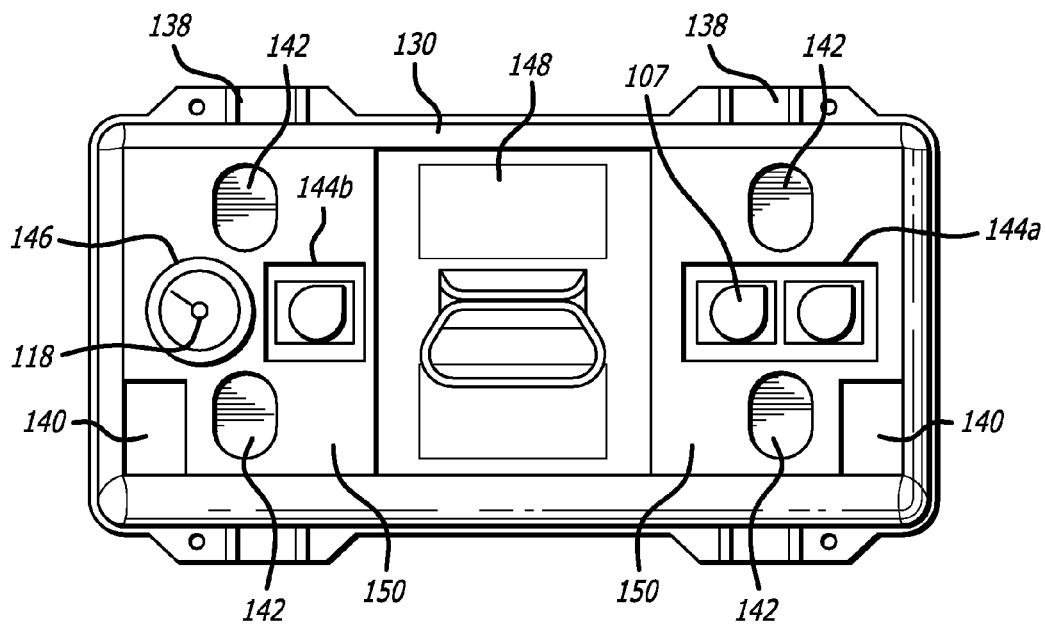
FIG. 3A depicts a case that houses a battery module according to one embodiment.
Figure 3B:
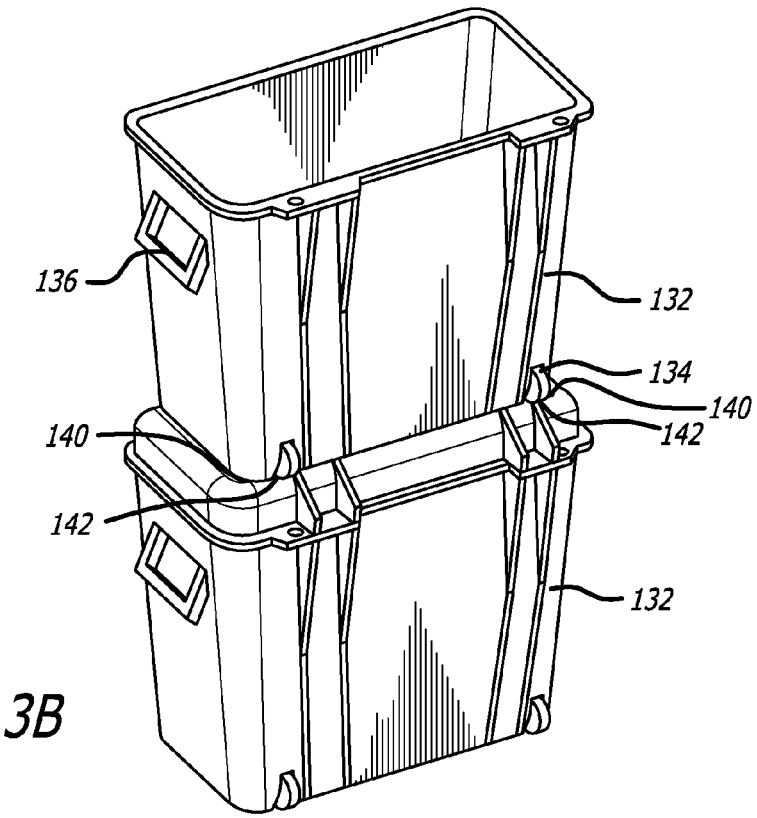
FIG. 3B depicts two cases stacked according to one embodiment.

Of course, each battery case may be a different structure than that shown in FIGS. 2A and 2B. For example, in some embodiments, each battery case may include a PELICAN® case or other similar structure for storing the battery module 105 and associated components. FIG. 3A depicts one embodiment of a case 104 that houses a battery module 105. The case 104 depicted in FIG. 3A is shown from the top (i.e., a top view), and is a modified PELICAN® case having a lid 130, a base 132 having wheels 134 affixed to the bottom of the base, and handles 136. The case 104 depicted in FIG. 3A also includes hinges 138 so that the lid 130 may be opened and rotate about the axis of the hinges 138. In the embodiment shown, the lid 130 of the PELICAN® case has been modified such that it includes two wheel bays 140, four docking bays 142, two power connector bays 144a and 144b, an energy capacity gauge bay 146, and a tray 148. In some embodiments, the modified lid 130 including these features may be made of any material or any combination of materials. The two wheel bays 140 and the four docking bays 142 are positioned to enable the stable stacking of two or more cases 104. FIG. 3B depicts two PELICAN® cases 104 stacked according to one embodiment. As shown, the two wheel bays 140 on the bottom case are positioned and adapted to receive the wheels 134. Also shown is that the four docking bays 142 are positioned and adapted to receive groove members positioned on the bottom of the base of the top case. In this way, the wheel bays 140 and the docking bays 142 prevent side-to-side movement of the stacked cases while allowing the stacked cases to be easily disengaged by, for example, allowing a user to lift the top case in the upward direction. Of course, other embodiments of the cases shown in FIGS. 3A and 3B may include interlocking members that may lock the two cases together. It is also appreciated that while two cases are shown stacked in FIG. 3B, more than two cases may be stacked together.

Referring back to FIG. 3A, the two power connector bays 144a and 144b include power connectors 107 (with removable caps) positioned therein such that the top of any power connector does not extend vertically beyond the surface 150. The energy capacity gauge bay 146 includes an energy capacity gauge 118 positioned therein such that the top of the gauge does not extend vertically beyond the surface 150. This design enables power connectors to be accessed from the top of the case 104 without jeopardizing the ability to stack, in a stable manner, two or more cases. For example, if the power connectors 107 were to extend beyond the surface 150, the top case depicted in FIG. 3B would teeter on the power connectors instead of sitting flush on the flat top surfaces of the bottom case. In the embodiment shown, power connector bay 144a includes two power connectors, and power connector bay 144b includes one power connector. The tray 148 may serve two purposes. For example, the tray 148 provides a flat surface on which system components such as a charger, inverter, or converter may be placed in embodiments where such components are not housed inside the case 104. The tray 148 is also positioned and adapted to receive groove members positioned on the bottom of the base of a top case in a stacking situation, such as that shown in FIG. 3B.

Among other components, each case may include an energy capacity gauge 118, one or more ammeters 119, and/or one or more circuit breakers 121. The energy capacity gauge 118 may be analog, digital, a video display, or any combination thereof. The energy capacity gauge 118 provides energy capacity information to a user. For example, the energy capacity gauge 118 may provide the available percentage of energy capacity associated with the battery module 105 housed inside the battery case 104 on which the energy capacity gauge is attached. In some embodiments, the enhanced battery system 100 may provide an audible alert and/or transmit a notification to a user device regarding the energy capacity status of one or more battery modules 105. According to some embodiments, each case 104 may include an ammeter 119 that shows the total current being drawn from the battery module 105 housed therein. Alternatively or additionally, each case 104 may include an ammeter 119 that is electrically connected with one or more power connectors located on or within the case. In some embodiments, an ammeter 119 may be connected to each power connector 107 to enable a user to determine the current being drawn by each load from a battery module 105. The one or more circuit breakers 121 may be connected, in series, to one or more of the power connectors 107 located on or within the case 104.

In some embodiments, each battery module case 104 may include one or more power connectors 107 that may be used to connect a load (i.e., any electronic device) or any other system component (e.g., a converter, an inverter, or a charger) to the battery module 105. In some embodiments, the structure 102 may include one or more power connectors 107 in addition to or in lieu of power connectors 107 located on the cases 104. In embodiments with three battery modules, the enhanced battery system 100 may, for example, be configured to ensure one battery module 105 is on standby fully charged while a second battery module 105 is being discharged and a third battery module 105 is being charged. In embodiments with two battery modules 105, the enhanced battery system 100 may, for example, be configured to ensure one battery module 105 is charging or on standby fully charged while a second battery module 105 is being discharged. It will be appreciated that any number and configuration of battery modules 105 may be used.

A plurality of power connectors 107 may be connected to the terminals of a battery module 105 in series, parallel, or a combination thereof. In this regard, a plurality of loads may be connected to the battery module via the power connectors 107 on each respective case 104 and/or the structure 102. In some embodiments, one or more of the power connectors 107 may be a camlock power connector (e.g., CAM LOCK 1015), a NEUTRIK® power connector, or any other power connector. A power connector 107 may connect to the anode and/or cathode of the battery module since the cables that connect to the power connectors 107 may include one or more wires or conductive paths. For example, a cable having two conductive paths may be connected to a single connector 107 that is internally connected to the anode and cathode of the battery module. As another example, a cable having one conductive path may be connected to single connector 107 that is internally connected to the anode or the cathode of the battery module.

One or more of the battery cases 104 may include one or more docking connectors 111 that may be received by the structure 102. When docked on the structure 102, the battery module 105 inside a case 104 may be electrically connected to the structure 102. The structure 102 may include conductive pathways to various components, such as one or more power connectors 107 or a power connector controller 113. According to such embodiments, power may be drawn from a docked battery module by connecting a load to one or more power connectors on the case and/or one or more power connectors on the structure. For example, a first load may be connected to two power connectors 107 (one for the anode and one for the cathode) on a case 104, and an inverter may be connected to two power connectors 107 (one for the anode and one for the cathode) on the structure 102 with a second load connected to the inverter. Those of ordinary skill in the art will appreciate that one or more loads requiring DC voltage may be connected in parallel with one or more loads requiring AC voltage.

Figure 4:
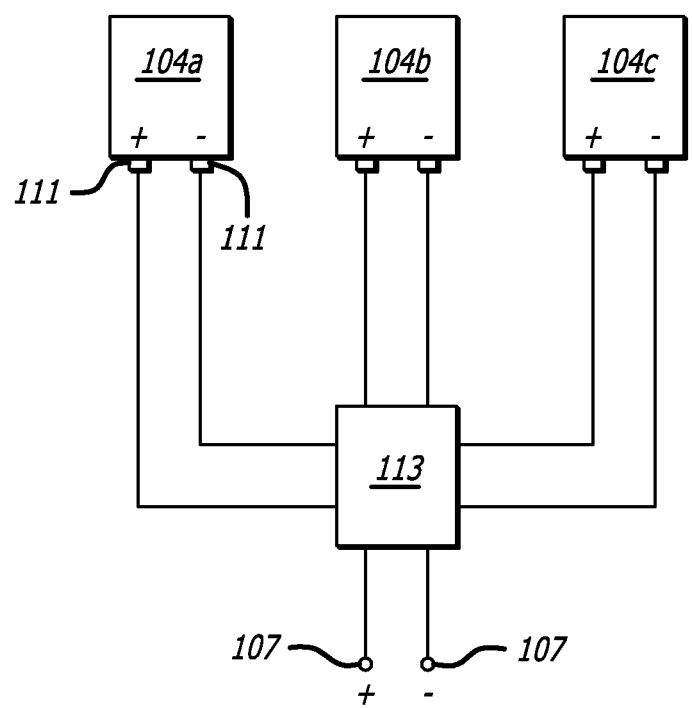
FIG. 4 depicts a simplified example of two dynamically reconfigurable power connectors according to one embodiment of the enhanced battery system.

Any power connector 107 positioned on a case may be statically associated with the battery module housed within the case 104 on which the power connector is positioned. A static power connector 107 is not reconfigurable with respect to which battery module 105 to which it is connected. For example, a static power connector 107 may only be connected to a single battery module 105. Any power connector 107 positioned on the structure 102 may be dynamically reconfigured manually by a user or automatically by the enhanced battery system 100. Otherwise stated, the electrical connection between any power connector 107 positioned about the structure 102 may be reconfigured so that any battery module 105 inside any case 104 may be connected to any power connector on the structure. FIG. 4 shows one embodiment of a simplified example of two dynamically reconfigurable power connectors 107 by using a power connector controller 113. The power connector controller 113 effectively operates as a multiplexer in that the battery module selected by the user or the system is connected to the power connectors 107.

The enhanced battery system 100 may also include a hot swap controller 117. The hot swap controller may be manually controlled by a user or automatically controlled by the enhanced battery system 100. The hot swap controller 117 may be configured to connect two or more battery modules in parallel. When it is determined that a battery module connected to a load has been discharged below a certain capacity (1%, 10%, or any percentage), the enhanced battery system may automatically connect a second, standby battery module that may be fully charged in parallel with the discharged battery module by instructing the hot swap controller 117 accordingly. After the second, standby battery module is connected to the discharged battery module, the enhanced battery system may automatically disconnect the discharged battery from the load. In this way, the enhanced battery system is enabled to ensure that continuous power may be provided to a load despite the discharged battery module being removed from the circuit. The enhanced battery system may proceed to automatically connect the discharged battery to a charger to initiate charging of the discharged battery.

Regarding manual control, for example, a user may provide input to a client device 116 (e.g., by selecting a virtual button in a graphical user interface presented on a display of the client device) to instruct the hot swap controller 117 to place two or more battery modules in parallel and/or to remove one or more battery modules 105 from a parallel configuration. The instruction data transmitted over a network 114 may be received by a network interface and routed directly to the hot swap controller 117. In other embodiments, the instruction data transmitted by the client device 116 may be received by a network interface and routed to a hardware processing unit. The hardware processing unit may process the data received by the client to determine what, if any, command to send to a system component. In this specific example, the hardware processing unit would determine that the instruction/command received from the client device should be sent to the hot swap controller 117. Once the hot swap controller 117 receives the instruction, the hot swap controller takes the appropriate action (e.g., by placing two or more battery modules 105 in a parallel configuration or by removing one or more battery modules from a parallel configuration).

As disclosed herein, each battery module 105 provides a default nominal system voltage. In some embodiments, any of the one or more chargers 106, one or more DC-to-AC inverters 108, and/or one or more DC-to-DC converters 110 may be manually connected to a battery module by a user. In some embodiments, a voltage controller 115 may be used to connect a battery module to one or more DC-to-DC converters or DC-to-AC inverters. The voltage controller 115 enables a user to select which DC or AC voltage the user would like the nominal voltage converted down or up to. For example, in an embodiment where a battery module 105 has a nominal voltage of 24 VDC, the power connectors 107 associated with the battery module provide 24 VDC. A user may operate the voltage controller 115 to select the desired DC or AC voltage (e.g., 12 VDC, 14.4 VDC, 28 VDC, 30 VDC, any other DC voltage, 120 VAC, or any other AC voltage). Once the selection is made, the power connectors 107 associated with the battery module provide the selected DC or AC voltage because the enhanced battery system 100 may connect the appropriate DC-to-DC converter or DC-to-AC inverter that may be housed by the structure 102. Of course, instead of using the voltage controller 115, a user may connect a desired converter or inverter directly to one or more power connectors 107. While described above as being specific to a battery module, it is appreciated that the voltage controller 115 may be specific to one or more power connectors 107. In this way, a single battery module may ultimately provide a plurality of different voltages at a plurality of power connectors. For example, a first set of power connectors (anode and cathode) may provide 24 VDC, a second set of power connectors may provide 14.4 VDC, and a third set of power connectors may provide 120 VAC.

Additionally or alternatively, any of the one or more chargers 106, one or more DC-to-AC inverters 108, and/or one or more DC-to-DC converters 110 may be automatically connected to a battery module 105 by the enhanced battery system 100 based on charger-required events, inverter-required events, and converter-required events. For example, a charger-required event may include when a battery module 105 is deemed to have been fully discharged or the battery module is discharged below a threshold value (e.g., below 5% of the battery module's energy capacity). Upon either of these events occurring, the enhanced battery system 100 may automatically connect a fully-charged battery module (e.g., a standby battery module) in parallel with the discharged battery to ensure that any load can continue to draw power from the enhanced battery system. Once the fully-charged battery module is connected in parallel with the discharged battery for a predetermined amount of time (e.g., 1 second, 5 seconds, or any length of time), the enhanced battery system may automatically disconnect the discharged battery from the load (i.e., remove the discharged battery from the parallel configuration with the standby battery module). Still further, audio indicators may be used alone or in combination with any visual indicator.

One or more power connectors 107 positioned on a case 104 or the structure 102 may include one or more indicators (e.g., one or more light sources, a display, or anything else that may be used to uniquely identify a power connector 107) that may be used to provide information to a user of the enhanced battery system 100. For example, a single light source (e.g., a single or multi-color LED) may be positioned adjacent to a power connector 107. As another example, an array of light sources (e.g., a single or multi-color LED array) positioned around a power connector 107. The state of the light source may be used to provide information to a user related the power connector 107. Different states of a light source may include, for example, whether the light source is illuminated, whether the light source is illuminated a particular color, and the like. Each different state of a light source may carry a different meaning related to the power connector. For example, green lights located about a power connector may indicate that the battery module associated with the power connector is fully charged. Flashing green lights may indicate that the battery module associated with the power connector is currently in use, i.e., being discharged. Red lights located about a power connector may indicate that the battery module associated with the power connector is fully discharged, and flashing red lights may indicate that the battery module is being charged. A non-illuminated light source may indicate that the power connector is not connected to a battery module.

In addition to or in lieu of the light source disclosure above, a display (e.g., a liquid crystal display, OLED, or any other display) may be positioned adjacent to a power connector 107. In other embodiments, each power connector may be numbered, colored, or otherwise have a unique identifier associated therewith. A single display attached to the structure 102 may be referenced by a user of the enhanced battery system 100 to obtain information related to the status of each battery module/case and information related to the power connectors 107. Information related to a battery module may include, for example, any information monitored by a battery management system, any data calculated using information monitored by a battery management system, and whether any battery module has been reconfigured to operate in series or parallel with another battery module. Information related to a power connector may include, for example, the battery module to which the power connector is electrically connected, the voltage provided by a power connector, and/or whether a converter or inverter is connected to the power connector.

Each battery case 104 may include at least one battery management system (BMS) 109 configured to manage the rechargeable cell(s). A battery management system is a specialized hardware processing unit that may be configured to process data specific to one or more battery modules. In some embodiments, two BMS 109 may be used per case. In other embodiments, each battery case 104 may not include at least one BMS because a single BMS may manage the battery modules in two or more cases. Reference numbers 109a, 109b, and 109c respectively refer to the BMS for each battery module housed in battery cases 104a, 104b, and 104c. Each BMS may be positioned inside each case that houses the cell(s) for each battery module and connected to the cell(s). One or more battery management systems may be connected to one another over the network 114 or a network independent from the network 114 such as a Controller Area Network ("CAN") bus to facilitate communication between battery management systems.

According to one embodiment, each battery case includes two BMS components (each BMS managing 4 cells), an energy capacity gauge, two camlock power connectors, and three NEUTRIK® power connectors. Again, it will be appreciated that the number of components and configurations can vary.

Referring specifically to the functionality of a BMS, each BMS may continuously or intermittently monitor in realtime any information relating to each cell that the BMS is configured to monitor. For example, and without limitation, information relating to voltage, current, temperature, state of charge (i.e., depth of discharge or how much energy a battery has left to discharge), state of charging (i.e., whether the cell is being charged), coolant flow, and coolant temperature associated with each cell may be monitored. Data corresponding to the monitored information may be used for computations. For example, cell data may be used to calculate a charge current limit, a discharge current limit, total amount of energy delivered over a period of time, total operating time, total number of charge cycles, total number of discharge cycles; total number of times a cell was discharged below a threshold energy capacity (e.g., below 10%, 20%, or any other percentage of the total energy capacity of a cell), amount of time a cell is below a threshold energy capacity before discharge, and any other calculation using cell data. The BMS may also manage the balance of the cells by, for example, shunting one or more cells.

The battery management systems 109 disclosed herein may be marine grade, military grade, or any other grade. The number of cells a BMS may manage varies depending on the BMS. Therefore, some embodiments may include a BMS to cells ratio of 1:1, 1:2, 1:3, 1:4, 1:20, 1:80, or 1:n; where n represents any number of cells. In this regard, a battery module may include any number of battery management systems so that each cell is appropriately monitored. In some embodiments, the battery modules disclosed herein may be derated (e.g., using a BMS) so that they discharge to 0%. In other embodiments, the battery modules disclosed herein may be derated so that they discharge below 10%. In some embodiments, a BMS may be manually or automatically turned off or put into sleep mode when a battery module is not actively powering a load so as to reduce the quiescent current; and therefore, the battery module's life.

FIG. 5 illustrates one embodiment of a method used with the enhanced battery system 100. At step 160, the system is initialized. In step 162, the one or more battery hardware processing units (e.g., one or more battery management system or comparable devices) monitor the charge status and condition of one or more battery modules 105. At step 164, the monitoring device or system determines if there has been any change in the status or condition of the one or more battery modules 105 or other associated components since the last determination made by the monitoring system. Such monitoring intervals can vary from micro seconds to longer periods of time lasting minutes, hours or days. If no status change is detected, the process may return to step 162 to continue monitoring the one or more battery modules 105.

In the event a status change is detected in step 164, the process continues at step 166 to provide a notification to a user of the status change. This notification can be accomplished in a multitude of ways, as previously discussed. If no notification is made at step 166, the process again returns to step 162 to continue monitoring the one or more battery modules and/or associated components for further status changes.

If a notification is to be made, then at step 168 such notification is transmitted to the user. Again, multiple methods to accomplish such transmission to the user can be used, such as the methods disclosed herein. As shown in step 170, such notification can take the form of a visual alert, an audio alert, a tactile alert (e.g., haptic vibration) any combination thereof, and the like. For example, a user device may vibrate and visually present information regarding a battery module being undocked from the structure 102. In this regard, team members may be apprised of actions of other users since any change to the system may result in a notification transmitted to any user device associated with the system.

The process continues to step 172 where the process determines if a user response or command is required. If so, the user can input his response and/or command into the user device at step 174 through a myriad of techniques (e.g., utilizing a touch screen). Thereafter, at step 176, the user response and/or command is transmitted by the user device back to the monitoring system. Continuing to step 178, the monitoring system then can reconfigure one or more of the battery modules 105 or associated components in accordance with the user response and/or command. At step 180, the system notifies the user of any reconfiguration made to the one or more battery modules or any associated component. Thereafter, the process returns to step 162 to continue the monitoring function.

In the event a user response to the notification in step 172 is not required, then the process continues at step 182. In this step, the system determines if an automatic (no user input required) reconfiguration of one or more battery modules and/or one or more associated components is required. If not, the process returns to step 162 to continue monitoring the battery modules and/or associated components.

However, in the event an automatic reconfiguration is required for one or more battery modules and/or associated components, then at step 184, such reconfiguration is made. Once made, the process continues to step 180 to notify the user that such a reconfiguration has occurred. Thereafter, the process returns to step 162 to continue the monitoring of the one or more battery modules and/or associated components.

Various aspects of the enhanced battery system 100 and methods, functions, steps, features and the like corresponding thereto may be implemented on one or more computer systems using hardware, software, firmware, circuits, or combinations thereof. Hardware, software, firmware, and circuits respectively refer to any hardware, software, firmware, or circuit component. Computer systems referred to herein may refer to any computing device and vice versa (e.g., smart phone, personal data assistant, tablet computer, laptop computer, desktop computer, other computing device, and the like). For example, the enhanced battery system 100, any computing device in the enhanced battery system 100, or any embodiment of a system disclosed herein may utilize one or more of the following components: a single-core or multi-core hardware processor (e.g., central processing unit or graphics processing unit) on which software instructions are executed (e.g., instructions corresponding to an operating system, an application program, an interpreter such as a virtual machine, or a compiler); a memory associated with and in connection with the hardware processor such as cache or other system memory that stores software instructions or other data that the hardware processor may access for processing; an input device (e.g., mouse, keyboard, touchscreen, and the like); an output device (e.g., display, touchscreen, printer, and the like); a network or communication interface that enables the computer system to communicate over a network or communication protocol; an application program having corresponding software instructions that are executable by a hardware processor. Connections between different computer systems and connections between different computer system components may be wired or wireless.

Every component of the enhanced battery system 100 may communicate with one another over the network, with one or more battery management systems, and/or with one or more hardware processors. For example, data transmitted by a user device to the enhanced battery system 100 may be received and processed by a hardware processor on the enhanced battery system 100.

Virtualization computing techniques, cloud computing techniques, web application/website computing techniques, traditional and adaptive streaming techniques, and other computing techniques may be implemented by the enhanced battery system 100 or any embodiment of a system disclosed herein to enable and/or enhance the teachings described herein. For example, in a cloud computing embodiment, one or more servers (i.e., one or more computer systems) may store and execute software instructions corresponding to an application program based on input data received from client devices. In response to the input data received, the application program is executed accordingly, which results in graphical data being processed and output to the client devices for display on a display such as a touch screen on a smart phone or tablet computer.

As another example, in a web application or website embodiment, data representative of a user input may be transmitted to a server (i.e., a computer system) hosting the website for processing and storage in memory. In an application program embodiment, the application may be stored and executed locally on a user's computer system. In other embodiments, one or more components of the application program may be stored and executed on a server and the user's computer system. For example, a user may download the application program from an app store for an ANDROID® computing device, BLACKBERRY® computing device, APPLE® computing device, WINDOWS® computing device, SAMSUNG® computing device, other computing device, and the like. Execution of the application program on the user's computing device may require that the device transmit and receive data to and from one or more computing devices such as a server or other user's computing device.

One or more embodiments of the enhanced battery system 100 may utilize streaming technology. Streaming data enables data to be presented to the user of the client device while the client device receives data from the server. Streaming data from servers to client devices (e.g., computing devices) over a network is typically limited by the bandwidth of the network, or alternatively, the physical layer net bitrate. Traditional streaming protocols, such as RTSP (Real-Time Streaming Protocol), MS-WMSP (Windows Media HTTP Streaming Protocol), and RTMP (Real Time Messaging Protocol) may be implemented, which essentially send data in small packets from the server to the client device in real-time at the encoded bitrate of the data. Adaptive streaming may also be implemented. Adaptive streaming almost exclusively relies on HTTP for the transport protocol. Similar to traditional streaming, data is encoded into discrete packets of a particular size; however, the source data is encoded at multiple bitrates rather than a single bitrate. The data packets corresponding to the same data encoded at different bitrates are then indexed based on the bitrate in memory. This streaming method works by measuring, in real-time, the available bandwidth and computer capacity of the client device, and adjusts which indexed data packet to transfer based on the encoded bitrate.

As disclosed herein, one or more aspects of the enhanced battery system 100 may be located on (i.e., processed, stored, executed, or the like; or include one or more hardware or software components) a single computer system or may be distributed among a plurality of computer systems attached by one or more communication networks (e.g., internet, intranet, a telecommunications network, and the like). One or more components of a computer system may be distributed across one or more computer systems in communication with the computer system over a communication network. For example, in some embodiments, the enhanced battery system 100 utilizes one or more servers (i.e., one or more computer systems dedicated for a particular purpose in the system) that may be dedicated to serve the needs of one or more other computer systems or components across a communication network and/or system bus. The one or more servers may provide a central processing location for one or more aspects of the enhanced battery system 100.

As disclosed herein, various aspects of the enhanced battery system 100 and methods, function, and steps corresponding thereto may be implemented on one or more computer systems using hardware, software, firmware, or combinations thereof. Those of ordinary skill in the art will appreciate that one or more circuits and/or software may be used to implement the system and methods described herein. Circuits refer to any circuit, whether integrated or external to a processing unit such as a hardware processor. Software refers to code or instructions executable by a computing device using any hardware component such as a processor to achieve the desired result. This software may be stored locally on a processing unit or stored remotely and accessed over a communication network.

As disclosed herein, a processor or hardware processor may refer to any hardware processor or software processor. A software processor may include or otherwise constitute an interpreter that is executed by a hardware processor. A computer system according to any embodiment disclosed herein is configured to perform any of the described functions related to the various embodiments of the enhanced battery system 100.

As disclosed herein, modules may include software instructions that when executed by a computing device, causes a desired method, function, step, feature, or result. Executed by a computing device includes execution by any hardware component (e.g., CPU, GPU, network interface, integrated circuits, other hardware components, and the like) of the computing device such as a hardware processor. Any module may be executed by a computing device (e.g., by a processor of the computing device). Any method, function, step, feature, result, and the like disclosed herein may be implemented by one or more software modules whether explicitly described or not. Individual components within a computing device may work together to accomplish a desired method, function, step, feature, or result. For example, a computing device may receive data and process the data. A simple example would be that a network interface receives the data and transmits the data over a bus to a processor.

Various aspects of the enhanced battery system 100 may be implemented as software executing in a computer system. The computer system may include a central processing unit (i.e., a hardware processor) connected to one or more memory devices, a graphical processing unit, input devices such as a mouse and keyboard, output devices such as speakers and a display, a network interface to connect to one or more other computer systems (e.g., one or more computer systems configured to provide a service such as function as a database), an operating system, a compiler, an interpreter (i.e., a virtual machine), and the like. The memory may be used to store executable programs and data during operation of the computer system. The executable programs may be written in a high-level computer programming language, such as Java or C++. Of course, other programming languages may be used since this disclosure is not limited to a specific programming language or computer system. Further, it is to be appreciated that the enhanced battery system 100 and methods are not limited to being executed on any particular computer system or group of computer systems.

Some methods, functions, steps, or features have been described as being executed by corresponding software by a processor. It is understood than any methods, functions, steps, features, or anything related to the enhanced battery system 100 may be implemented by hardware, software (e.g., firmware), or circuits despite certain methods, functions, steps, or features having been described herein with reference to software corresponding thereto that is executable by a processor to achieve the desired method, function, or step. It is understood that software instructions may reside on a non-transitory medium such as one or more memories accessible to one or more processors in the enhanced battery system 100. For example, where a computing device receives data, it is understood that the computing device processes that data whether processing the data is affirmatively stated or not. Processing the data may include storing the received data, analyzing the received data, and/or processing the data to achieve the desired result, function, method, or step. It is further understood that input data from one computing device or system may be considered output data from another computing device or system, and vice versa. It is yet further understood that any methods, functions, steps, features, results, or anything related to the enhanced battery system 100 may be represented by data that may be stored on one or more memories, processed by one or more computing devices, received by one or more computing devices, transmitted by one or more computing devices, and the like.

The various embodiments and examples described herein are provided by way of illustration only and should not be construed to limit the claimed invention, nor the scope of the various embodiments and examples. Those skilled in the art will readily recognize various modifications and changes that may be made to the claimed invention without following the example embodiments and applications illustrated and described herein, and without departing from the true spirit and scope of the claimed invention, which is set forth in the following claims. In addition, various embodiments may be combined. Therefore, reference to an embodiment, one embodiment, in some embodiments, in other embodiments, and the like does not preclude one or more methods, functions, steps, features, results, hardware implementations, or software implementations of different embodiments from being combined. Further, reference to an embodiment, one embodiment, in some embodiments, in other embodiments, examples, and the like provides various aspects that may or may not be combined with those of one or more different embodiments and/or examples. Still further, the enhanced battery system 100 and corresponding methods should not be construed as limited to one particular industry or use. Those skilled in the art will appreciate that the enhanced battery system 100 and corresponding methods may be used with any device requiring electrical input. Further, many industries will appreciate use of such an enhanced battery system, including, but not limited to entertainment, medical, military, aviation, education, food processing, manufacturing, computer and digital technology, search and rescue, and the like.

What is claimed is:

1. A method for providing energy via a battery system, the method comprising:

associating two or more battery modules in combination together, wherein each battery module has a state of charge;

monitoring the plurality of battery modules using a battery management system to determine the state of charge of each battery module;

maintaining the plurality of battery modules so that at least one battery module is in a state of charge while another battery module is being used to provide energy to one or more devices; and reconfiguring the plurality of battery modules when the at least one charged battery module reaches depletion to enable the one or more remaining charged battery modules to provide energy to the one or more devices.

2. A method for managing a plurality of battery modules, the method comprising:

providing a battery system including a first rechargeable battery module and a second rechargeable battery module, wherein the first and second rechargeable battery modules are in communication with a hardware processor;

providing a network interface in communication with the hardware processor, wherein the network interface enables the hardware processor to transmit data over a network;

providing at least one battery management system in communication with the first battery module;

providing at least one battery management system in communication with the second battery module;

determining, by the hardware processor, whether a notification event related to the first or second battery module has occurred; and transmitting notification data over the network when the notification event occurs.

3. The method as set forth in claim 2, further comprising:
receiving, by a client device, the notification data; and
presenting, by the client device, the notification data or information related to the notification data.

4. The method as set forth in claim 3, further comprising:
receiving, by the client device, an input;
generating, by the client device, data representative of the input; and
transmitting the data representative of the input over the network.

5. The method as set forth in claim 4, further comprising receiving, by the hardware processor, the data representative of the input transmitted over the network.

6. The method as set forth in claim 5, further comprising altering a connection to the first or second battery module based on the data representative of the input.

7. The method as set forth in claim 6, wherein altering the connection includes instructing, by the hardware processor, a first power connector to disconnect from the first battery module.

8. The method as set forth in claim 7, wherein a disconnect instruction is sent by the hardware processor to a multiplexer that controls two or more connections to the first power connector.

9. The method as set forth in claim 8, wherein the multiplexer disconnects the first power connector from the first battery module based on the disconnect instruction.

10. The method as set forth in claim 6, wherein altering the connection includes instructing, by the hardware processor, the first power connector to connect to the second battery module.

11. The method as set forth in claim 5, further comprising instructing, by the hardware processor, the first battery module to disconnect from a first load based on the data representative of the input.

12. The method as set forth in claim 11, further comprising disconnecting the first battery module from the first load based on the instruction output by the hardware processor.

13. The method as set forth in claim 5, further comprising instructing, by the hardware processor, the first battery module to connect to a second load based on the data representative of the input.

14. The method as set forth in claim 13, further comprising connecting the first battery module to the second load based on the instruction output by the hardware processor.

15. The method as set forth in claim 5, further comprising instructing, by the hardware processor, the first battery module and the second battery module to connect in parallel based on the data representative of the input.

16. The method as set forth in claim 15, further comprising connecting the first battery module in parallel with the second battery module based on the instruction output by the hardware processor.

17. The method as set forth in claim 5, further comprising instructing, by the hardware processor, the first battery module and the second battery module to connect in series based on the data representative of the input.

18. The method as set forth in claim 17, further comprising connecting the first battery module in series with the second battery module based on the instruction output by the hardware processor.

19. A system for managing a battery module system, the system comprising:
a non-transitory memory in communication with a processor, wherein the non-transitory memory has instructions stored thereon that, in response to execution by the processor, cause the processor to perform operations, comprising:
determining whether a notification event related to at least one battery module has occurred;
disconnecting, without user input, a first system component from the at least one battery module based on the occurrence of the notification event, wherein the first system component includes a charger, an inverter, a converter, a power connector, or a second battery module; and
connecting, without user input, a second system component to the at least one battery module based on the occurrence of the notification event, wherein the second system component includes a charger, an inverter, a converter, a power connector, or a second battery module.

20. The system as set forth in claim 19, wherein the operations further comprise determining the at least one battery module has been discharged to or below an available energy capacity threshold.

21. The system as set forth in claim 20, wherein the available energy capacity threshold is between the range of 0.01% and 99.9%.

22. The system as set forth in claim 20, wherein the operations further comprise transmitting a notification to a client device based on the available energy capacity threshold determination.

23. The system as set forth in claim 19, wherein the operations further comprise determining the at least one battery module has been discharged to or below an available energy capacity threshold for a period of time.

24. The system as set forth in claim 19, wherein the operations further comprise determining the at least one battery module has been charged to or above an available energy capacity threshold.

25. The system as set forth in claim 24, wherein the available energy capacity threshold is between the range of 0.01% and 99.9%.

26. The system as set forth in claim 24, wherein the operations further comprise transmitting a notification to a client device based on the available energy capacity threshold determination.

27. The system as set forth in claim 19, wherein the operations further comprise determining the at least one battery module has been charged to or above an available energy capacity threshold for a period of time.

28. A system for managing a battery module system, the system comprising:
a non-transitory memory in communication with a processor, wherein the non-transitory memory has instructions stored thereon that, in response to execution by the processor, cause the processor to perform operations, comprising:
determining whether a notification event related to at least one battery module has occurred;
transmitting notification data over a network to a client device when the notification event occurs;
processing client device data transmitted by the client device over a network;
disconnecting a first system component from the at least one battery module based on the client device data, wherein the first system component includes a charger, an inverter, a converter, a power connector, or a second battery module; and
connecting a second system component to the at least one battery module based on the client device data, wherein the second system component includes a charger, an inverter, a converter, a power connector, or a second battery module.

29. A system for managing a battery module system, the system comprising:
a computing device operable to:
determine whether a notification event related to at least one battery module has occurred;
disconnect, without user input, a first system component from the at least one battery module based on the occurrence of the notification event, wherein the first system component includes a charger, an inverter, a converter, a power connector, or a second battery module; and
connect, without user input, a second system component to the at least one battery module based on the occurrence of the notification event, wherein the second system component includes a charger, an inverter, a converter, a power connector, or a second battery module.

30. The system as set forth in claim 29, wherein the computing device is operable to determine the at least one battery module has been discharged to or below an available energy capacity threshold.

31. The system as set forth in claim 30, wherein the available energy capacity threshold is between the range of 0.01% and 99.9%.

32. The system as set forth in claim 30, wherein the computing device is operable to transmit a notification to a client device based on the available energy capacity threshold determination.

33. The system as set forth in claim 29, wherein the computing device is operable to determine the at least one battery module has been discharged to or below an available energy capacity threshold for a period of time.

34. The system as set forth in claim 29, wherein the computing device is operable to determine the at least one battery module has been charged to or above an available energy capacity threshold.

35. The system as set forth in claim 34, wherein the available energy capacity threshold is between the range of 0.01% and 99.9%.

36. The system as set forth in claim 34, wherein the computing device is operable to transmit a notification to a client device based on the available energy capacity threshold determination.

37. The system as set forth in claim 29, wherein the computing device is operable to determine that the at least one battery module has been charged to or above an available energy capacity threshold for a period of time.

38. A system for managing a battery module system, the system comprising:
a computing device operable to:
determine whether a notification event related to at least one battery module has occurred;
transmit notification data over a network to a client device when the notification event occurs;
process client device data transmitted by the client device over a network;
disconnect a first system component from the at least one battery module based on the client device data, wherein the first system component includes a charger, an inverter, a converter, a power connector, or a second battery module; and
connect a second system component to the at least one battery module based on the client device data, wherein the second system component includes a charger, an inverter, a converter, a power connector, or a second battery module.

39. A system, comprising:
one or more memories in communication with one or more hardware processors of one or more computing devices, wherein the one or more memories have instructions stored thereon that, in response to execution by the one or more computing devices, cause the one or more computing devices to perform operations, comprising:
determining whether a notification event related to at least one battery module has occurred;
disconnecting, without user input, a first system component from the at least one battery module based on the occurrence of the notification event, wherein the first system component includes a charger, an inverter, a converter, a power connector, or a second battery module; and
connecting, without user input, a second system component to the at least one battery module based on the occurrence of the notification event, wherein the second system component includes a charger, an inverter, a converter, a power connector, or a second battery module.

40. A system, comprising:
one or more memories in communication with one or more hardware processors of one or more computing devices, wherein the one or more memories have instructions stored thereon that, in response to execution by the one or more computing devices, cause the one or more computing devices to perform operations, comprising:
determining whether a notification event related to at least one battery module has occurred;
transmitting notification data over a network to a client device when the notification event occurs;
processing client device data transmitted by the client device over a network;
disconnecting a first system component from the at least one battery module based on the client device data, wherein the first system component includes a charger, an inverter, a converter, a power connector, or a second battery module; and
connecting a second system component to the at least one battery module based on the client device data, wherein the second system component includes a charger, an inverter, a converter, a power connector, or a second battery module.

41. An article of manufacture including a non-transitory computer-readable medium having instructions stored thereon that, in response to execution by a computing device, cause the computing device to perform operations, comprising:
determining whether a notification event related to at least one battery module has occurred;
disconnecting, without user input, a first system component from the at least one battery module based on the occurrence of the notification event, wherein the first system component includes a charger, an inverter, a converter, a power connector, or a second battery module; and
connecting, without user input, a second system component to the at least one battery module based on the occurrence of the notification event, wherein the second system component includes a charger, an inverter, a converter, a power connector, or a second battery module.

42. An article of manufacture including a non-transitory computer readable medium having instructions stored thereon that, in response to execution by a computing device, cause the computing device to perform operations, comprising:
determining whether a notification event related to at least one battery module has occurred;
transmitting notification data over a network to a client device when the notification event occurs;
processing client device data transmitted by the client device over a network;
disconnecting a first system component from the at least one battery module based on the client device data, wherein the first system component includes a charger, an inverter, a converter, a power connector, or a second battery module; and
connecting a second system component to the at least one battery module based on the client device data, wherein the second system component includes a charger, an inverter, a converter, a power connector, or a second battery module.

43. A battery system, comprising:
a first battery module and a second battery module, wherein each battery module includes one or more rechargeable electrochemical cells, wherein each battery module has at least three states associated with it: charging, discharging, and standby;
at least one battery management system connected to the first battery module;

at least one battery management system connected to the second battery module;
a first housing, wherein the first battery module resides within the first housing;
a second housing, wherein the second battery module resides within the second housing;
a hardware processor in communication with the at least one battery management system connected to the first and second battery modules, wherein the at least one battery management system connected to the first battery module is configured to transmit information related to the first battery module to the hardware processor, wherein the at least one battery management system connected to the second battery module is configured to transmit information related to the second battery module to the hardware processor, wherein the hardware processor unit is configured to determine the state of the first and second battery modules, and wherein the hardware processor is enabled to alter to the state of the first battery module or the second battery module without user input based on information associated with at least one of the battery modules.

44. The system as set forth in claim 43, wherein the standby state is based on energy capacity.

45. The system as set forth in claim 44, wherein the first or second battery module is in the standby state when fully charged, charged above 90% energy capacity, charged above 80% energy capacity, or charged above 50% energy capacity.

46. The system as set forth in claim 43, wherein the standby state for the first or second battery module occurs when the first or second battery module is not connected to a load.

47. The system as set forth in claim 43, wherein the hardware processor is enabled to alter the state of the first battery module or the second battery module without user input from charging to discharging, charging to standby, discharging to charging, discharging to standby, standby to charging, or standby to discharging.

48. The system as set forth in claim 43, wherein the hardware processor is enabled to alter the state of the first battery module or the second battery module with user input received from a client device from charging to discharging, charging to standby, discharging to charging, discharging to standby, standby to charging, or standby to discharging.

49. The system as set forth in claim 43, wherein the hardware processor is enabled to alter the state of the first battery module or the second battery module based on a notification event occurring from charging to discharging, charging to standby, discharging to charging, discharging to standby, standby to charging, or standby to discharging.

* * * * *